(12) United States Patent
Yasutake et al.

(10) Patent No.: US 12,641,856 B2
(45) Date of Patent: May 26, 2026

(54) SEMICONDUCTOR DEVICE

(71) Applicants: Kabushiki Kaisha Toshiba, Tokyo
(JP); **Toshiba Electronic Devices &
Storage Corporation**, Tokyo (JP)

(72) Inventors: Takuya Yasutake, Kanazawa Ishikawa
(JP); Hiroaki Katou, Nonoichi
Ishikawa (JP)

(73) Assignees: Kabushiki Kaisha Toshiba, Kawasaki
(JP); **Toshiba Electronic Devices &
Storage Corporation**, Kawasaki (JP)

( * ) Notice: Subject to any disclaimer, the term of this
patent is extended or adjusted under 35
U.S.C. 154(b) by 553 days.

(21) Appl. No.: 18/120,704

(22) Filed: Mar. 13, 2023

(65) Prior Publication Data

US 2024/0096974 A1     Mar. 21, 2024

(30) Foreign Application Priority Data

Sep. 20, 2022    (JP) ................................. 2022-149560

(51) Int. Cl.
H10D 64/00      (2025.01)
H10D 30/01      (2025.01)
H10D 30/66      (2025.01)
H10D 64/01      (2025.01)
(52) U.S. Cl.
CPC ....... H10D 64/118 (2025.01); H10D 30/0297
(2025.01); H10D 30/668 (2025.01); **H10D
64/01 (2025.01); H10D 64/117** (2025.01)
(58) Field of Classification Search
CPC ............. H10D 64/118; H10D 30/0297; H10D
30/668; H10D 64/01; H10D 64/117;
H10D 64/111; H10D 64/112; H10D
64/513; H10D 64/685
See application file for complete search history.

(56) References Cited

U.S. PATENT DOCUMENTS

| | | | |
|---|---|---|---|
| 7,176,520 B2 | 2/2007 | Miyake et al. | |
| 7,279,743 B2 | 10/2007 | Pattanayak et al. | |
| 7,420,213 B2 | 9/2008 | Chae et al. | |
| 8,816,393 B2 | 8/2014 | Yamamura | |
| 8,969,157 B2 | 3/2015 | Takahashi et al. | |

(Continued)

FOREIGN PATENT DOCUMENTS

| | | |
|---|---|---|
| JP | 2006-95786 A | 4/2006 |
| JP | 2007-513523 A | 5/2007 |

(Continued)

OTHER PUBLICATIONS

Japanese Office Action mailed Sep. 5, 2025 in corresponding
Japanese Patent Application 2022-149560 with English Translation,
8 pages.

*Primary Examiner* — Shahed Ahmed
*Assistant Examiner* — Khatib A Rahman
(74) *Attorney, Agent, or Firm* — Kim & Stewart LLP

(57)     ABSTRACT

A semiconductor device according to the present embodi-
ment includes a drain electrode, a source electrode, a semi-
conductor region disposed between the drain electrode and
the source electrode, a gate electrode disposed in the semi-
conductor region via a first insulation film, and a second
insulation film disposed between the gate electrode and the
source electrode and having a specific dielectric constant
higher than a specific dielectric constant of the first insula-
tion film.

6 Claims, 21 Drawing Sheets

(56)                References Cited

U.S. PATENT DOCUMENTS

|  |  |  |  |  |
|---|---|---|---|---|
| 8,981,470 | B2 | 3/2015 | Nozu |  |
| 9,000,497 | B2 | 4/2015 | Sato et al. |  |
| 9,177,813 | B2 | 11/2015 | Miura |  |
| 9,530,850 | B2 | 12/2016 | Aichinger et al. |  |
| 10,121,892 | B2* | 11/2018 | Nishiwaki | H10D 30/0297 |
| 11,107,898 | B2* | 8/2021 | Kikuchi | H10D 64/513 |
| 11,462,637 | B2 | 10/2022 | Baba |  |
| 2006/0076898 | A1 | 4/2006 | Kitazawa |  |
| 2007/0181939 | A1 | 8/2007 | Huang et al. |  |
| 2007/0246770 | A1 | 10/2007 | Nakamura et al. |  |
| 2013/0134505 | A1* | 5/2013 | Kobayashi | H10D 30/668 |
|  |  |  |  | 438/270 |
| 2013/0168760 | A1 | 7/2013 | Hsieh |  |
| 2013/0228788 | A1 | 9/2013 | Yamamura |  |
| 2014/0077278 | A1 | 3/2014 | Nozu |  |
| 2014/0077778 | A1 | 3/2014 | Sato et al. |  |
| 2014/0287574 | A1 | 9/2014 | Takahashi et al. |  |
| 2016/0020107 | A1 | 1/2016 | Miura |  |
| 2017/0213908 | A1* | 7/2017 | Fursin | H10D 62/106 |
| 2017/0263767 | A1* | 9/2017 | Nishiwaki | H10D 64/513 |
| 2020/0403076 | A1 | 12/2020 | Ku et al. |  |
| 2021/0288176 | A1* | 9/2021 | Tomita | H10D 30/668 |
| 2021/0296490 | A1* | 9/2021 | Shiraishi | H10D 30/0297 |
| 2022/0157952 | A1* | 5/2022 | Fujino | H10D 64/01 |

FOREIGN PATENT DOCUMENTS

| | | |
|---|---|---|
| JP | 2007-165824 A | 6/2007 |
| JP | 2007-523487 A | 8/2007 |
| JP | 2008-263095 A | 10/2008 |
| JP | 2012-89851 A | 5/2012 |
| JP | 5063933 B2 | 10/2012 |
| JP | 2013-182992 A | 9/2013 |
| JP | 2013-183061 A | 9/2013 |
| JP | 2014-060298 A | 4/2014 |
| JP | 5612830 B2 | 10/2014 |
| JP | 2016-129226 A | 7/2016 |
| JP | 2022-048752 A | 3/2022 |
| WO | 2005-057615 A2 | 6/2005 |
| WO | 2005-081323 A2 | 9/2005 |
| WO | 2015155828 A1 | 10/2015 |

* cited by examiner

1

2s    OP

8

6

5

21

22

3

4

23

T

2

24

7

1A

2s     OP

8

6

5

21

22

4

23

3

9

2

T

24

7

Z

X     Y

1C

2s OP

6

8

21

22

6a

4a

4b

3

23

T

2

24

7

Z

X Y

1D

2s    OP

6

8

5

21

22

6a 4a    4b

23

3

9

2

T

24

7

SEMICONDUCTOR DEVICE

CROSS-REFERENCE TO RELATED APPLICATIONS

This application is based upon and claims the benefit of priority from the prior Japanese Patent Application No. 2022-149560, filed on Sep. 20, 2022; the entire contents of which are incorporated herein by reference.

FIELD

Embodiments described herein relate generally to a semiconductor device

BACKGROUND

In a metal oxide semiconductor field effect transistor (MOSFET), a phenomenon called self-turn-on in which a transition from an off-state to an on-state is unintentionally made is known. The self-turn-on is caused in a case where a voltage between a drain electrode and a source electrode rapidly changes with time when the MOSFET is turned off, and in a case where capacitance Cgs between a gate electrode and the source electrode is charged via a capacitor Cgd between the gate electrode and the drain electrode, and thus a voltage equal to or higher than a gate threshold voltage is induced.

As means for suppressing the self-turn-on, it is conceivable to increase gate resistance and reduce the switching speed of the MOSFET. However, in some cases, it is not preferable to change the magnitude of the gate resistance due to design constraints.

As another means for suppressing the self-turn-on, it is conceivable to increase the capacitance Cgs between the gate electrode and the source electrode. However, when the thickness of an interlayer insulation film between the gate electrode and the source electrode is reduced in order to increase the capacitance Cgs, the dielectric strength of the interlayer insulation film decreases. As a result, a short-circuit easily occurs between the gate electrode and the source electrode.

DETAILED DESCRIPTION

Figure 1:
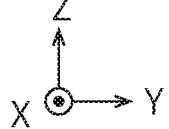
FIG. 1 is a cross-sectional view of a semiconductor device according to a first embodiment.

A semiconductor device according to the present embodiment includes a drain electrode, a source electrode, a semiconductor region disposed between the drain electrode and the source electrode, a gate electrode disposed in the semiconductor region via a first insulation film, and a second insulation film disposed between the gate electrode and the source electrode and having a specific dielectric constant higher than a specific dielectric constant of the first insulation film.

Embodiments will now be explained with reference to the accompanying drawings. The embodiments are not limited to the present invention. The drawings are schematic or conceptual, and the ratio of each portion is not necessarily the same as actual one. In the specification and the drawings, the same elements as those described above in the previously illustrated drawings are denoted by the same reference numerals, and the detailed description thereof will be appropriately omitted.

For convenience of description, an XYZ orthogonal coordinate system is adopted as illustrated in the drawings. A Z-axis direction is a stacking direction (thickness direction) of the semiconductor device. In the Z-axis direction, a source region 21 side is also referred to as "upper side", and a drain electrode 7 side is also referred to as "lower side". However, this expression is for convenience and independent of the direction of gravity.

In the following description, notations of $n^+$, n, and $n^-$, and notations of $p^+$, p, and $p^-$ may be used to represent the relative level of an impurity concentration in each conductivity type. $n^+$ indicates that n-type impurity concentration is relatively higher than that of n, and $n^-$ indicates that the n-type impurity concentration is relatively lower than that of n. $p^+$ indicates that p-type impurity concentration is relatively higher than that of p, and $p^-$ indicates that the p-type impurity concentration is relatively lower than that of p. In the configuration of the semiconductor device to be described below, the n-type and the p-type may be inverted.

First Embodiment

A semiconductor device 1 according to the first embodiment will be described with reference to FIG. 1. In the present embodiment, the semiconductor device 1 is a vertical MOSFET having a trench gate.

FIG. 1 is a cross-sectional view of the semiconductor device 1 according to the first embodiment. As illustrated in FIG. 1, the semiconductor device 1 includes a semiconductor region 2, an insulation film 3, a gate electrode 4, an insulation film 5, a source electrode 6, a drain electrode 7, and an insulation film 8. Hereinafter, details of each element will be described with reference to FIG. 1.

The semiconductor region 2 includes a source region 21, a base region 22, a drift region 23, and a drain region 24. The semiconductor region 2 is disposed on the drain electrode 7. Hereinafter, for convenience of description, a surface of the semiconductor region 2 is assumed to be substantially planar, and the surface on an upper side is referred to as a main surface 2s. This does not limit the shape of the semiconductor region 2.

The source region 21 is a semiconductor region that functions as a source of the MOSFET. As illustrated in FIG. 1, the source region 21 is disposed at the top of the semiconductor region 2. The source region 21 is, for example, an $n^+$-type semiconductor region.

The base region 22 is a semiconductor region that functions as a base of the MOSFET. The base region 22 is disposed between the drift region 23 and the source region 21. In a case where a voltage is applied to the gate electrode 4, the base region 22 forms a channel and allows carriers to flow between the drift region 23 and the source region 21. The base region 22 is, for example, a p-type semiconductor region.

The drift region 23 is a semiconductor region that functions as a drift of the MOSFET. The drift region 23 is, for example, an $n^-$-type semiconductor region.

The drain region 24 is a semiconductor region that functions as a drain of the MOSFET. The drain region 24 is disposed between the drain electrode 7 and the drift region 23. The drain region 24 is, for example, an $n^+$-type semiconductor region.

The semiconductor region 2 may include a semiconductor region having a function other than the functions of the above-described regions 21 to 24.

The semiconductor region 2 may be an epitaxial layer, may be at least a part of a semiconductor substrate, or may include the epitaxial layer and the semiconductor substrate.

The semiconductor region 2 is made of, for example, silicon (Si), but may be made of a compound semiconductor such as SiC or GaN. In a case where silicon (Si) is used as a semiconductor material, for example, arsenic (As), phosphorus (P), or antimony (Sb) is used as an n-type impurity. In a case where silicon (Si) is used as the semiconductor material, for example, boron (B) is used as a p-type impurity.

The insulation film 3 electrically insulates the gate electrode 4 from the semiconductor region 2. The insulation film 3 is made of an insulation material (hereinafter, referred to as a "first insulation material") such as silicon oxide ($SiO_2$).

The insulation film 3 is disposed, for example, on an inner wall of a trench T. The trench T is a trench provided so as to reach the drift region 23 from the main surface 2s. As illustrated in FIG. 1, the insulation film 3 provided on the inner wall of the trench T is provided so as to be in contact with the source region 21, the base region 22, and the drift region 23. The trench T has a virtual opening surface s on which an opening of the trench T is formed, the opening surface s being flush with the main surface 2s. The opening surface s is indicated by a dotted line in FIG. 1. The insulation film 5 to be described later is formed on the opening surface s. For convenience of description, the trench T is provided on the main surface 2s of the semiconductor region 2, but this does not limit the shape of the semiconductor region 2.

The gate electrode 4 is an electrode that functions as a gate electrode of the MOSFET. The gate electrode 4 is disposed in the insulation film 3. That is, the gate electrode 4 is disposed in the semiconductor region 2 via the insulation film 3. More specifically, the gate electrode 4 is adjacent to at least the base region 22 via the insulation film 3 in the Y direction. The gate electrode 4 is made of, for example, polysilicon. Hereinafter, as illustrated in FIG. 1, it is described that an upper surface of the gate electrode 4 is covered by the insulation film 3. The upper surface of the gate electrode 4 may be exposed to the opening surface s.

The insulation film 5 is disposed between the gate electrode 4 and the source electrode 6 to be described later. As illustrated in FIG. 1, the insulation film 5 is disposed on the opening surface s and the semiconductor region 2 (main surface 2s). Since the insulation film 5 functions as an etching stopper in a manufacturing process of the semiconductor device 1 to be described later, the insulation film 5 on the opening surface s is thinner than the insulation film 5 on the main surface 2s.

The insulation film 5 only needs to be disposed at least on the opening surface s of the trench T, and may not be disposed on the semiconductor region 2 (main surface 2s).

The specific dielectric constant of the insulation film 5 is higher than the specific dielectric constant of the insulation film 3. The insulation film 5 is made of, for example, an insulation material (hereinafter, referred to as a "second insulation material") such as silicon nitride.

The source electrode 6 is disposed above the insulation film 5. The source electrode 6 is electrically connected to the source region 21 via a source contact (not illustrated).

As illustrated in FIG. 1, in a case where the insulation film 3 is disposed on the gate electrode 4, the insulation film 3 and the insulation film 5 insulate the gate electrode 4 from the source electrode 6. In a case where the insulation film 3 is not disposed on the gate electrode 4 (that is, in a case where the gate electrode 4 is exposed to the opening surface s of the trench T), the insulation film 5 insulates the gate electrode 4 from the source electrode 6.

The source electrode 6 is made of, for example, metal such as titanium (Ti), tungsten (W), or aluminum (Al).

The drain electrode 7 is an electrode that functions as a drain electrode of the MOSFET. The drain electrode 7 is disposed under the semiconductor region 2. The drain electrode 7 is electrically connected to the drain region 24. The drain electrode 7 is made of, for example, metal such as titanium, tungsten, or aluminum.

The insulation film 8 is disposed on the insulation film 5. The insulation film 8 is provided with an opening OP through which the insulation film 3 is exposed from a bottom surface. As illustrated in FIG. 1, the source electrode 6 is disposed not only on the insulation film 8 but also in the opening OP.

The insulation film 8 is made of, for example, an insulation material (hereinafter, referred to as a "third insulation material") such as silicon oxide.

Functions and effects of the semiconductor device 1 according to the present embodiment will be described. A gate-source capacitance Cgs is generated between the source electrode 6 and the gate electrode 4. The insulation film 5 disposed between the gate electrode 4 and the source electrode 6 has a specific dielectric constant higher than that of the insulation film 3. Therefore, the capacitance Cgs can be increased more than a case where the insulation film between the source electrode 6 and the gate electrode 4 is only the insulation film 3.

As described above, in the present embodiment, the insulation film 5 having a specific dielectric constant higher than that of the insulation film 3 is disposed between the gate electrode 4 and the source electrode 6, and thus the gate-source capacitance Cgs can be increased without increasing a gate resistance. In other words, the semiconductor device 1 can reduce the ratio Cgd/Cgs. As a result, the semiconductor device 1 can suppress self-turn-on.

In the present embodiment, it is not necessary to reduce a distance between the gate electrode 4 and the source electrode 6 in order to increase the gate-source capacitance Cgs. That is, the insulation film 5 having a relatively high specific dielectric constant is disposed between the gate electrode 4 and the source electrode 6, and thus in the semiconductor device 1, the gate-source capacitance Cgs can be increased while maintaining an insulation film thickness with which a predetermined dielectric strength is achieved. Therefore, the semiconductor device 1 can suppress the self-turn-on while securing the dielectric strength between the gate and the source.

Thus, according to the first embodiment, without increasing the gate resistance, the semiconductor device 1 can suppress the self-turn-on while securing the dielectric strength between the gate and the source. The semiconductor device 1 can suppress self-turn-on even in a case where the gate resistance is reduced for the purpose of increasing the switching speed.

<Method for Manufacturing Semiconductor Device>

Next, an example of a method for manufacturing the semiconductor device 1 will be described with reference to FIGS. 2A to 2G. FIGS. 2A to 2G are cross-sectional views in steps for explaining the method for manufacturing the semiconductor device 1.

Figure 2A:
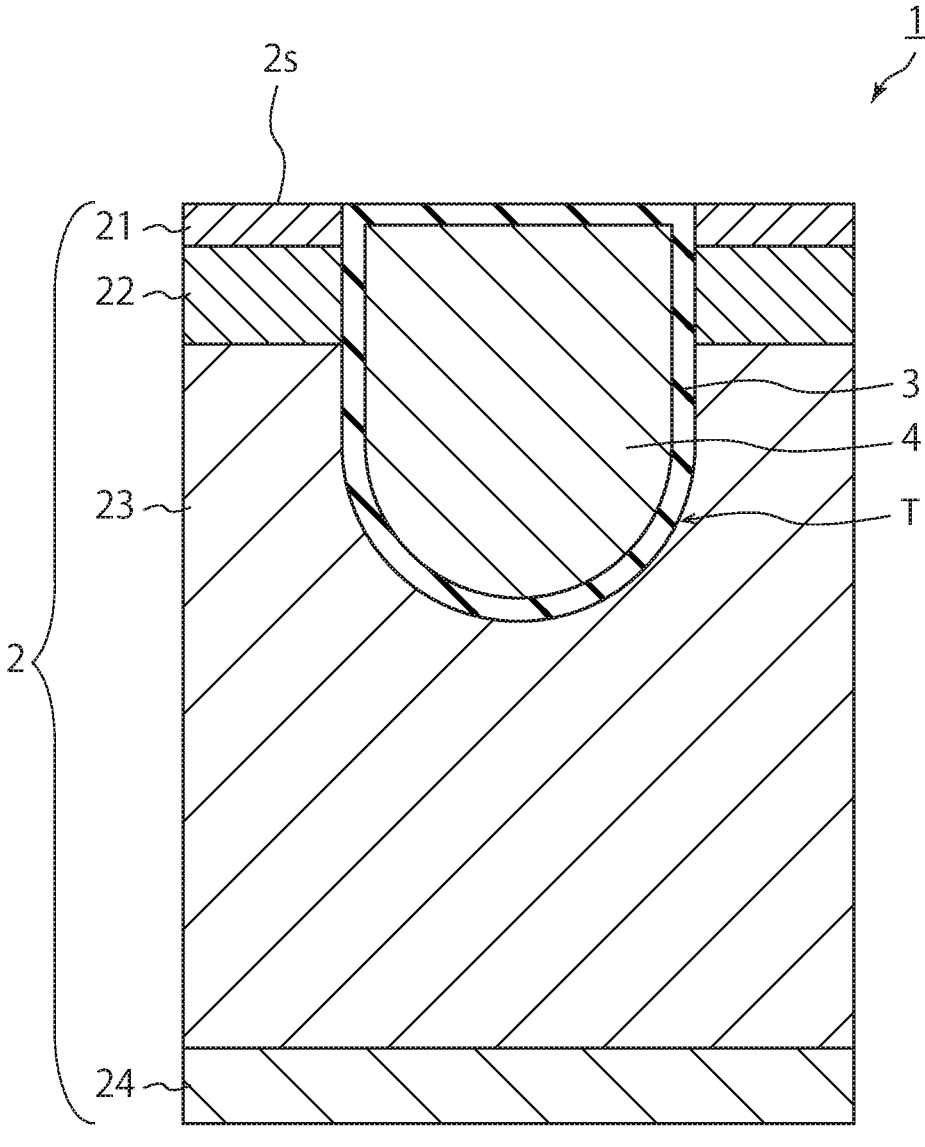
FIG. 2A is a cross-sectional view for explaining an example of a step of a method for manufacturing the semiconductor device according to the first embodiment.
Figure 2A:
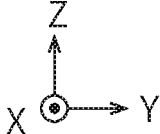

First, as illustrated in FIG. 2A, the semiconductor region 2 having the main surface 2s is prepared. The semiconductor region 2 includes the source region 21, the base region 22, the drift region 23, and the drain region 24. The trench T reaching the drift region 23 from the main surface 2s is provided in the semiconductor region 2, and the insulation film 3 is disposed on the inner wall of the trench T. The gate electrode 4 is disposed in the insulation film 3.

Figure 2B:
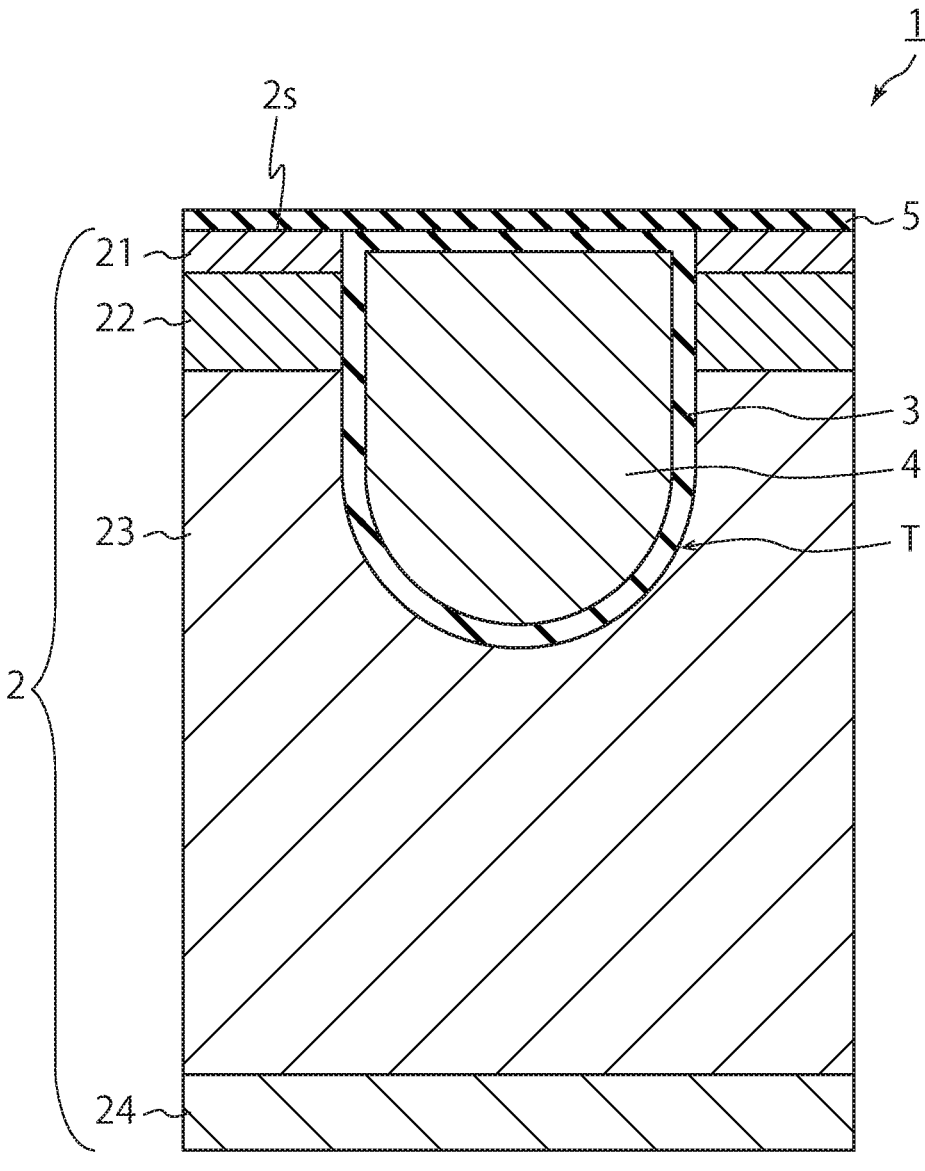
FIG. 2B is a cross-sectional view for explaining an example of a step of a method for manufacturing the semiconductor device according to the first embodiment, subsequent to FIG. 2A.
Figure 2B:
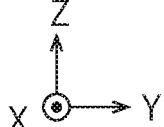

Next, as illustrated in FIG. 2B, the second insulation material is deposited on the insulation film 3 and the semiconductor region 2 (source region 21) by, for example, a CVD method. The second insulation material has a specific dielectric constant higher than that of the first insulation material forming the insulation film 3. Accordingly, the insulation film 5 is formed.

Figure 2C:
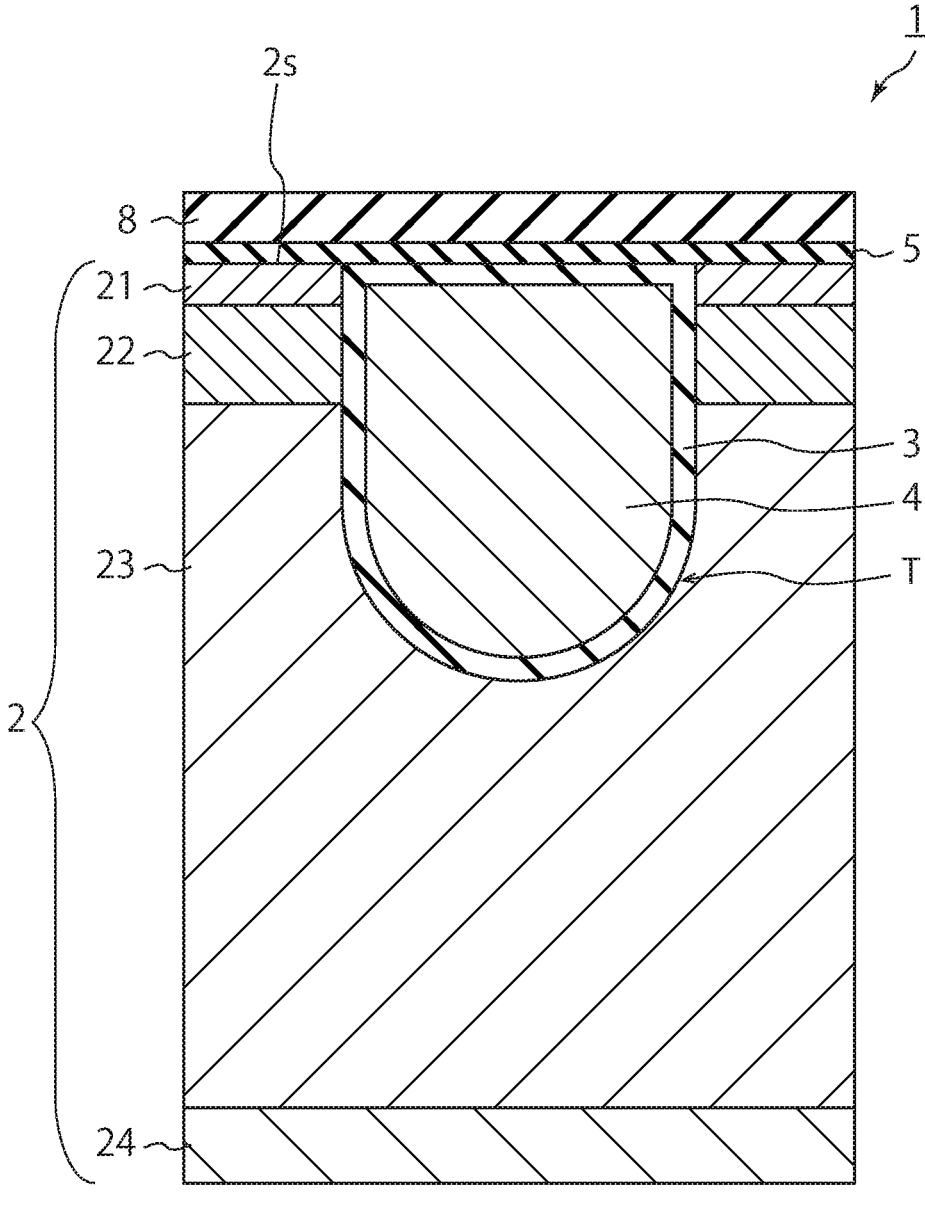
FIG. 2C is a cross-sectional view for explaining an example of a step of a method for manufacturing the semiconductor device according to the first embodiment, subsequent to FIG. 2B.
Figure 2C:
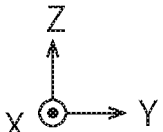

Next, as illustrated in FIG. 2C, the third insulation material is deposited on the insulation film 5 by, for example, the CVD method. Accordingly, the insulation film 8 is formed.

Figure 2D:
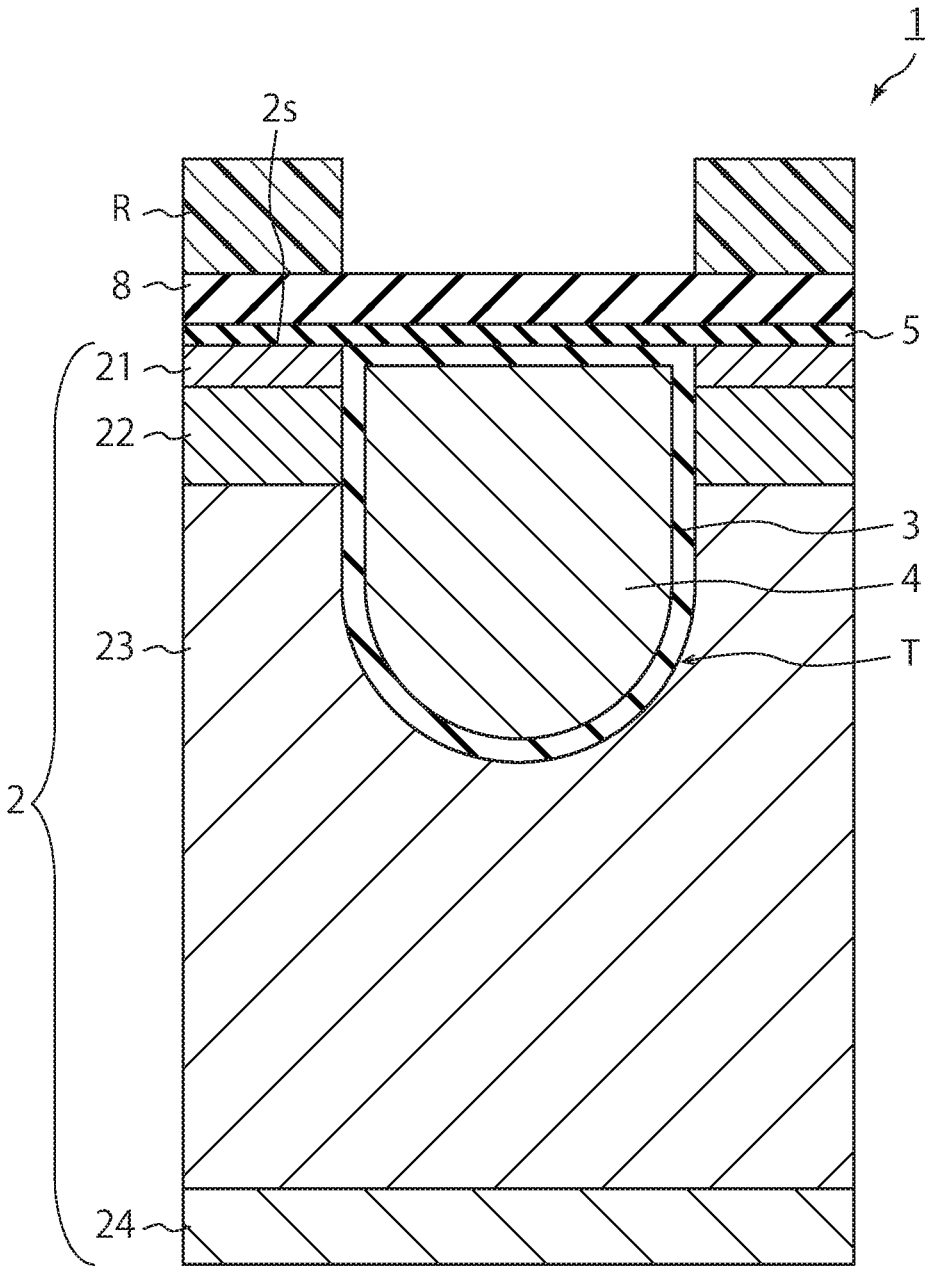
FIG. 2D is a cross-sectional view for explaining an example of a step of a method for manufacturing the semiconductor device according to the first embodiment, subsequent to FIG. 2C.
Figure 2D:
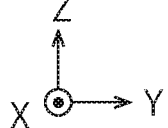

Next, as illustrated in FIG. 2D, a photoresist R is applied onto the insulation film 8, and selectively exposed and developed to form a mask of the photoresist on the insulation film 8.

Figure 2E:
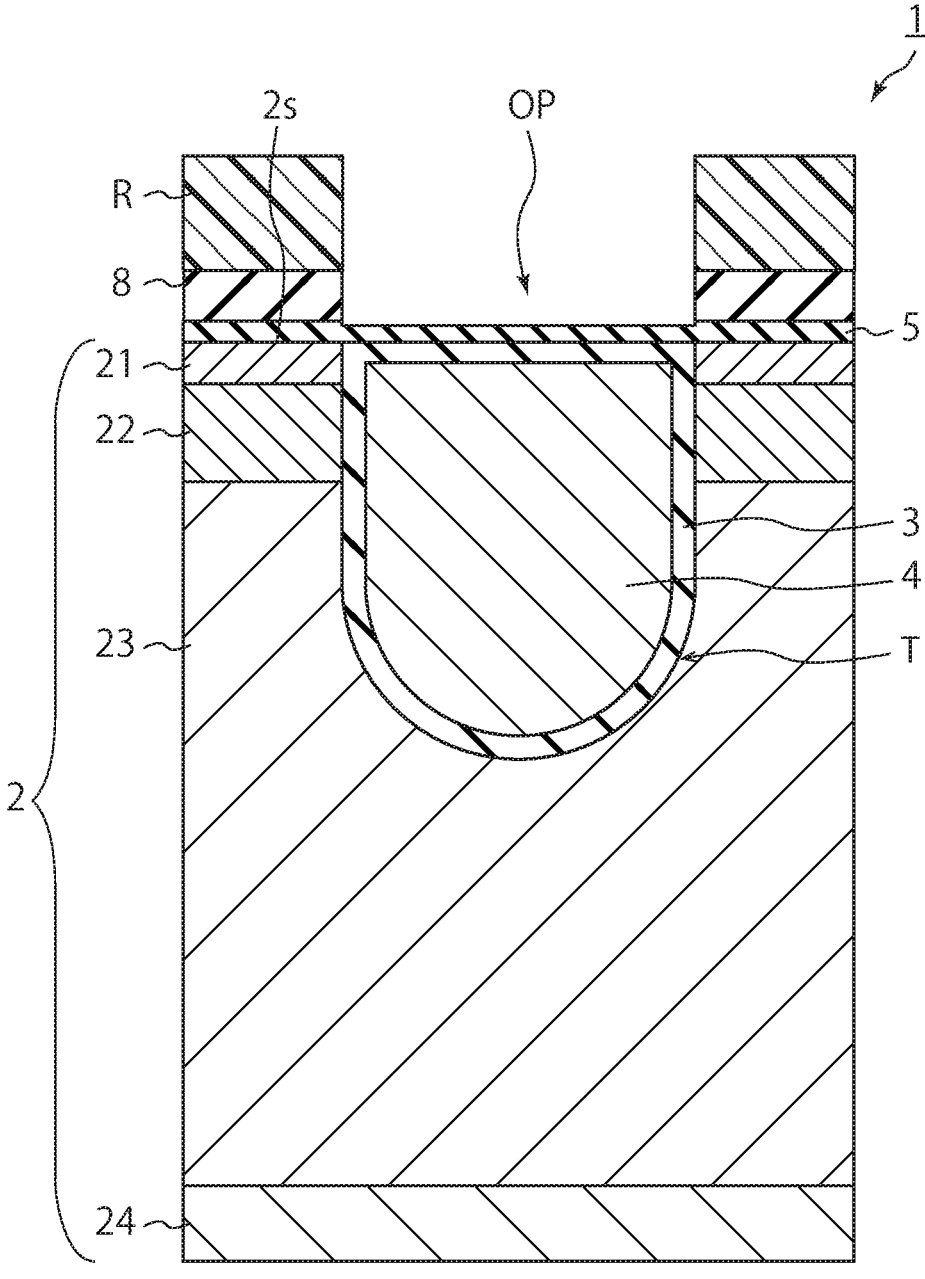
FIG. 2E is a cross-sectional view for explaining an example of a step of a method for manufacturing the semiconductor device according to the first embodiment, subsequent to FIG. 2D.
Figure 2E:
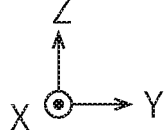

Next, as illustrated in FIG. 2E, etching for removing a portion of the insulation film 8 not masked by the photoresist is performed by, for example, reactive ion etching (RIE). Accordingly, the opening OP is formed on the insulation film 8. At the time of this etching, the insulation film 5 serves as an etching stopper, and unintended etching for the insulation film 3 can be prevented. The final film thickness of the insulation film 5 is determined by the etching. That is, the capacitance Cgs is adjusted by the etching. Since the speed of RIE for silicon nitride is slower than the speed of RIE for silicon oxide, the film thickness of the insulation film 5 can be easily controlled. Therefore, the variation of the capacitance Cgs can be suppressed.

Figure 2F:
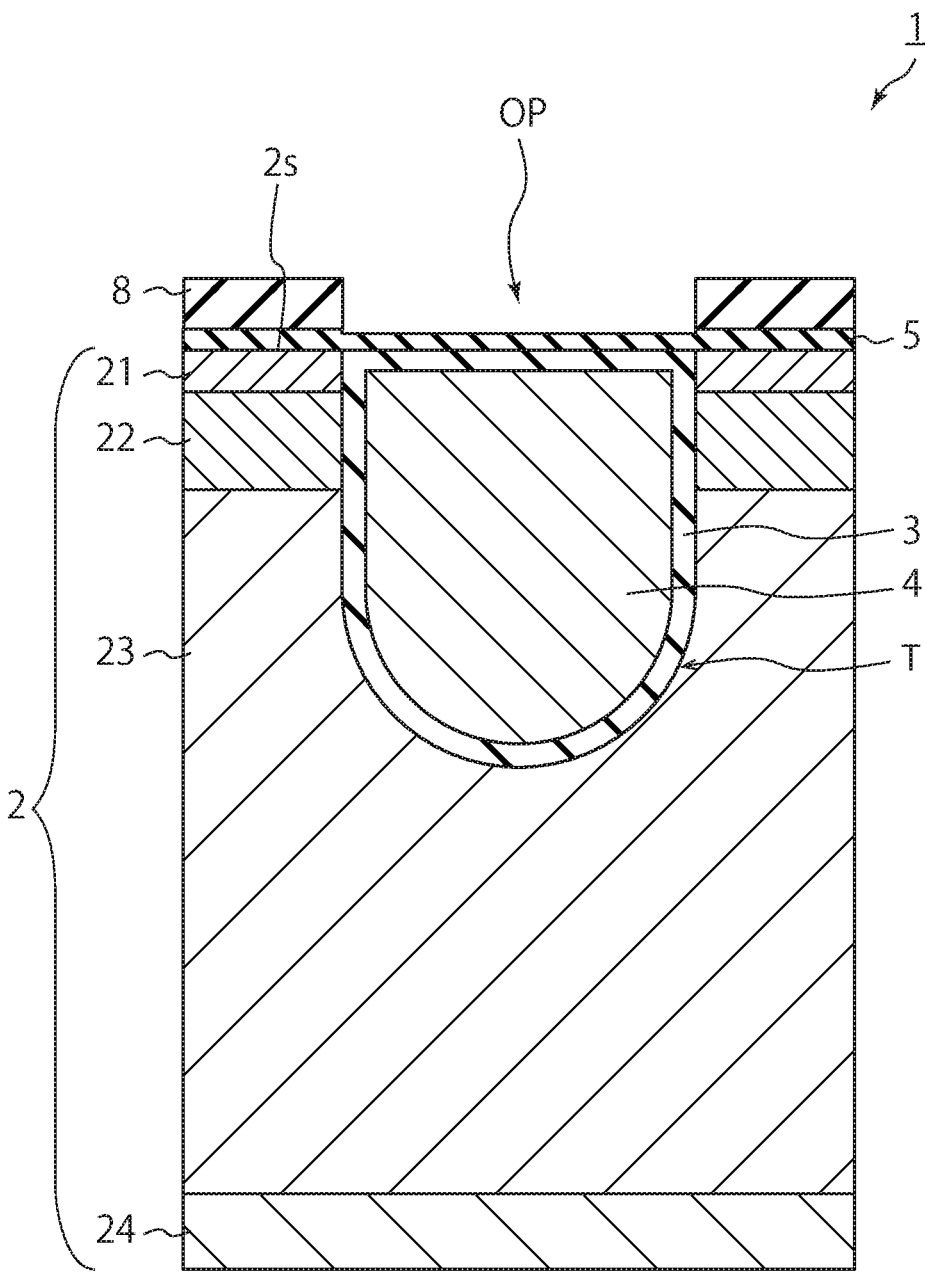
FIG. 2F is a cross-sectional view for explaining an example of a step of a method for manufacturing the semiconductor device according to the first embodiment, subsequent to FIG. 2E.
Figure 2F:
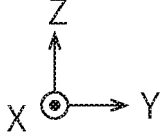

Next, as illustrated in FIG. 2F, the photoresist R is peeled off by using, for example, a developer.

Figure 2G:
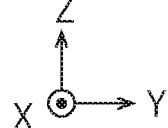
FIG. 2G is a cross-sectional view for explaining an example of a step of a method for manufacturing the semiconductor device according to the first embodiment, subsequent to FIG. 2F.

Next, as illustrated in FIG. 2G, metal is deposited on the insulation film 5 exposed to the opening OP and on the insulation film 8 by using, for example, a sputtering method to form the source electrode 6. Thereafter, metal is also deposited on the lower surface of the semiconductor region 2 to form the drain electrode 7. In the step of forming the source electrode, the drain electrode 7 may be formed.

Through the above-described steps, the semiconductor device 1 according to the first embodiment is manufactured.

As described above, in the step of etching the insulation film 8, the insulation film 5 serves as an etching stopper. Therefore, the insulation film 3 is prevented from being unintentionally etched. Since the speed of RIE for the insulation film 5 is relatively slow, the gate-source capacitance Cgs can be easily adjusted, and the variation in capacitance Cgs can be suppressed. As a result, the yield of the semiconductor device 1 can be improved.

The above description is merely an example of the manufacturing method. For example, the insulation film 8 may not be formed. In this case, since the opening OP is not formed, the step of forming and peeling off the photoresist R is also unnecessary. The insulation film 5 may not be formed on the main surface 2s. That is, the insulation film 5 may be formed only on the insulation film 3.

Modification Example of First Embodiment

Figure 3:
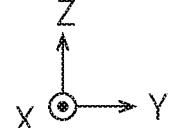
FIG. 3 is a cross-sectional view illustrating another configuration example of the semiconductor device according to the first embodiment.

Next, the modification example of the first embodiment will be described with reference to FIG. 3. As illustrated in FIG. 3, in the present modification example, the semiconductor device 1 further includes an insulation film 8a.

As illustrated in FIG. 3, the insulation film 8a is partially disposed on the insulation film 5 exposed to the opening of the insulation film 3. The insulation film 8a is made of, for example, the insulation material (third insulation material) such as silicon oxide. The insulation film 8a may be formed in the same step as that of the insulation film 8. That is, after the insulation film 8 is formed on the insulation film 5, the insulation film 8 may be etched to form the two openings OP on the right and left sides, and thus the insulation film 8a may be formed.

The insulation film 8a increases a distance between the gate electrode 4 and the source electrode 6 at a place at which the insulation film 8a is disposed, and decreases the capacitance Cgs at the place. The capacitance Cgs of the entire semiconductor device 1 can be adjusted by adjusting a width (length in the Y-axis direction) of the insulation film 8a. In other words, the width of the insulation film 8a is determined based on a design value of the capacitance Cgs of the semiconductor device 1.

According to the present modification example, the capacitance Cgs of the semiconductor device 1 can be easily adjusted by providing the insulation film 8a.

Second Embodiment

Figure 4:
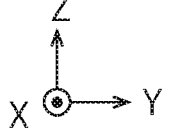
FIG. 4 is a cross-sectional view illustrating a semiconductor device according to a second embodiment.

Next, the second embodiment will be described with reference to FIG. 4. FIG. 4 is a cross-sectional view illustrating a semiconductor device 1A according to the second embodiment. In FIG. 4, elements having the same names or functions as those in the drawings described in the above-described embodiment are denoted by the same reference numerals. Hereinafter, the description will be omitted except for the matters changed or added.

One of the differences between the second embodiment and the first embodiment is the configuration of the electrode disposed in the insulation film 3. As illustrated in FIG. 4, the semiconductor device 1A according to the second embodiment further includes a field plate (FP) electrode 9 in addition to the gate electrode 4 in the insulation film 3.

The FP electrode 9 is disposed to increase a withstand voltage by alleviating the concentration of reverse electric field between the gate electrode 4 and the drain electrode 7. The FP electrode 9 is disposed in the insulation film 3 so as to be positioned below the gate electrode 4. That is, the FP electrode 9 is separated from the gate electrode 4, and is disposed in the semiconductor region 2 via the insulation film 3 at a position farther from the opening surface s of the trench T than the position of the gate electrode 4. The FP electrode 9 is made of, for example, polysilicon.

The FP electrode 9 and the gate electrode 4 are electrically insulated from the semiconductor region 2 by the insulation film 3.

The FP electrode 9 is electrically connected to the source electrode 6 via a source contact (not illustrated). Therefore, the gate-source capacitance Cgs is generated also between the FP electrode 9 and the gate electrode 4. Therefore, according to the second embodiment, the capacitance Cgs can be further increased. The capacitance Cgs can be adjusted with a higher degree of freedom.

As described above, in the second embodiment, since the insulation film 5 having a relatively high specific dielectric constant is disposed between the gate electrode 4 and the source electrode 6, it is possible to suppress the self-turn-on without increasing the gate resistance while securing the dielectric strength between the gate and the source as in the first embodiment.

In the second embodiment, since the FP electrode 9 is disposed in the insulation film 3, the capacitance Cgs can be further increased. Therefore, the thickness of the insulation film between the gate electrode 4 and the source electrode 6 can be increased, and the dielectric strength between the gate and the source of the semiconductor device 1A can be improved.

Modification Example of Second Embodiment

Figure 5:
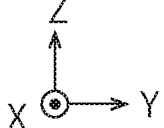
FIG. 5 is a cross-sectional view illustrating another configuration example of the semiconductor device according to the second embodiment.

Next, the modification example of the second embodiment will be described with reference to FIG. 5. As illustrated in FIG. 5, in the present modification example, the semiconductor device 1A further includes the insulation film 8a as in the modification example of the first embodiment.

As illustrated in FIG. 5, the insulation film 8a is partially disposed on the insulation film 5 exposed to the opening of the insulation film 3. The capacitance Cgs of the entire semiconductor device 1A can be adjusted by adjusting a width of the insulation film 8a as in the modification example of the first embodiment. In other words, the width of the insulation film 8a is determined based on a design value of the capacitance Cgs of the semiconductor device 1A.

According to the present modification example, the capacitance Cgs of the semiconductor device 1A can be easily adjusted by providing the insulation film 8a.

Third Embodiment

Figure 6:
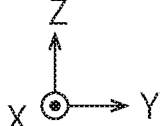
FIG. 6 is a cross-sectional view illustrating a semiconductor device according to a third embodiment.

Next, the third embodiment will be described with reference to FIG. 6. FIG. 6 is a cross-sectional view illustrating a semiconductor device 1B according to the third embodiment. Elements having the same names or functions as those in the drawings described in the above-described embodiment are denoted by the same reference numerals. Hereinafter, the description will be omitted except for the matters changed or added.

One of the differences between the third embodiment and the embodiments described above is the configuration of the gate electrode. As illustrated in FIG. 6, the semiconductor device 113 according to the third embodiment includes two electrodes (a gate electrode 4a and a gate electrode 4b) disposed to be opposed to each other as gate electrodes. In FIG. 6, the gate electrode 4a and the gate electrode 4b extend in a direction (X-axis direction) in which the insulation film 3 extends and are separated from each other in a Y-axis direction. Hereinafter, a structure including the gate electrode 4a and the gate electrode 4b as gate electrodes is referred to as a separate gate structure. In the separate gate structure, the width (length in the Y-axis direction) of the gate electrode is easily adjusted, and thus the gate capacitance and the gate resistance is easily adjusted. The gate electrode 4a and the gate electrode 4b are examples of a first gate electrode and a second gate electrode in the claims, respectively.

Although not illustrated, the separate gate structure of the present embodiment is also applied to a case where the FP electrode 9 is not disposed.

In the third embodiment, the insulation film 5 having a relatively high specific dielectric constant is disposed between the gate electrode 4 and the source electrode 6 as in the first embodiment. Therefore, without increasing the gate resistance, the semiconductor device 113 can suppress the self-turn-on while securing the dielectric strength between the gate and the source.

In the third embodiment, since the separate gate structure is adopted, the width of the gate electrode can be easily adjusted, and a semiconductor device having a desired gate width can be provided. That is, according to the third embodiment, a semiconductor device having desired gate resistance and/or gate capacitance can be provided.

Modification Example of Third Embodiment

Figure 7:
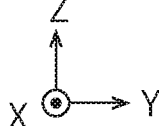
FIG. 7 is a cross-sectional view illustrating another configuration example of the semiconductor device according to the third embodiment.

Next, the modification example of the third embodiment will be described with reference to FIG. 7. As illustrated in FIG. 7, in the present modification example, the semiconductor device 113 further includes an insulation film 8a.

As illustrated in FIG. 7, the insulation film 8*a* is disposed on the insulation film 5 directly on the insulation film 3 between the gate electrode 4*a* and the gate electrode 4*b*. Therefore, in the insulating film including the insulation film 8 and the insulation film 8*a*, an opening OP1 and an opening OP2 are provided directly above the gate electrode 4*a* and the gate electrode 4*b*, respectively.

In the separate gate structure, as illustrated in FIG. 6 described in the third embodiment, the capacitance Cgs is generated not only directly above the gate electrode 4*a* and the gate electrode 4*b* but also obliquely above the gate electrode 4*a* and the gate electrode 4*b*. Therefore, when the capacitance Cgs is designed, it is necessary to consider the influence of the component of the capacitance Cgs generated obliquely above the gate electrodes 4*a* and 4*b*.

On the other hand, in the present modification example, a distance between the gate electrodes 4*a* and 4*b* and the source electrode 6 increases in the portion obliquely above the gate electrodes 4*a* and 4*b* due to the insulation film 8*a*. Therefore, in the semiconductor device 1B, the capacitance Cgs generated obliquely above the gate electrodes 4*a* and 4*b* can be reduced. As a result, in the semiconductor device 1B, the influence of the capacitance Cgs generated obliquely above the gate electrode 4*a* and the gate electrode 4*b* can be reduced, and thus the capacitance Cgs can be more easily designed.

Fourth Embodiment

Figure 8:
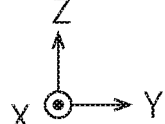
FIG. 8 is a cross-sectional view illustrating a semiconductor device according to a fourth embodiment.

Next, the fourth embodiment will be described with reference to FIG. 8. FIG. 8 is a cross-sectional view illustrating a semiconductor device 1C according to the fourth embodiment. Elements having the same names or functions as those in the drawings described in the above-described embodiment are denoted by the same reference numerals. Hereinafter, the description will be omitted except for the matters changed or added.

One of the differences between the fourth embodiment and the embodiments described above is a method of increasing the gate-source capacitance Cgs. In the above-described embodiment, the method of increasing the gate-source capacitance Cgs by disposing the insulation film 5 between the gate electrode 4 and the source electrode 6 has been described. In the present embodiment, a method of increasing the capacitance Cgs without using the insulation film 5 will be described.

In the fourth embodiment, the separate gate structure is adopted as in the third embodiment. As illustrated in FIG. 8, the source electrode 6 includes an inter-gate electrode 6*a* disposed between the gate electrode 4*a* and the gate electrode 4*b*. The insulation film 3 is disposed so as to insulate the source electrode 6 from the gate electrode 4*a* and the source electrode 6 from the gate electrode 4*b*.

As illustrated in FIG. 8, the semiconductor device 1C may include the insulation film 8 disposed on the semiconductor region 2 (main surface 2*s*) and provided with the opening OP at a position corresponding to the upper side of the insulation film 3. The source electrode 6 is disposed not only on the insulation film 8 but also in the opening OP of the insulation film 8. As illustrated in FIG. 8, the insulation film 3 is not exposed in the opening OP of the insulation film 8. The insulation film 3 may be exposed in the opening OP. The insulation film 8 may be made of the same insulation material (first insulation material) as that of the insulation film 3, or may be integrated with the insulation film 3. In this case, the insulation film 8 may be formed in the same step as that of the insulation film 3.

In the present embodiment, in the separate gate structure, the source electrode 6 includes the inter-gate electrode 6*a* disposed between the gate electrode 4*a* and the gate electrode 4*b*. Therefore, in the semiconductor device 1C, the gate-source capacitance Cgs can be generated not only on the upper surface sides of the gate electrode 4*a* and the gate electrode 4*b* but also on the side surface sides of the gate electrode 4*a* and the gate electrode 4*b*. As a result, in the semiconductor device 1C, the capacitance Cgs of the MOSFET can be increased.

Therefore, in semiconductor device 1C, the capacitance Cgs can be increased without reducing the thickness of the insulation film 3 between the gate electrode (gate electrode 4*a* and the gate electrode 4*b*) and the source electrode 6.

As described above, in the separate gate structure, the inter-gate electrode 6*a* of the source electrode 6 is disposed between the gate electrode 4*a* and the gate electrode 4*b*, and thus the gate-source capacitance Cgs can be increased while maintaining the insulation film thickness having a predetermined dielectric strength in the semiconductor device 1C. Therefore, according to the fourth embodiment, without using the insulation film 5, the self-turn-on can be suppressed while securing the dielectric strength between the gate and the source without increasing the gate resistance.

According to the fourth embodiment, since it is not necessary to form the insulation film 5, the manufacturing step of the semiconductor device can be simplified.

Modification Example of Fourth Embodiment

Figure 9:
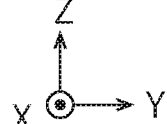
FIG. 9 is a cross-sectional view illustrating another configuration example of the semiconductor device according to the fourth embodiment.

Next, the modification example of the fourth embodiment will be described with reference to FIG. 9. As illustrated in FIG. 9, in the present modification example, the semiconductor device 1C further includes the FP electrode 9 as in the second embodiment.

As illustrated in FIG. 9, the FP electrode 9 is disposed in the insulation film 3 so as to be positioned below the gate electrode 4*a* and the gate electrode 4*b*. Therefore, in the semiconductor device 1C, the thickness of the insulation film between the gate electrode 4*a* and the source electrode 6 and between the gate electrode 4*b* and the source electrode 6 can be increased, and the dielectric strength between the gate and the source of the semiconductor device 1C can be improved.

Fifth Embodiment

Figure 10:
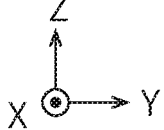
FIG. 10 is a cross-sectional view illustrating a semiconductor device according to a fifth embodiment.

Next, the fifth embodiment will be described with reference to FIG. 10. FIG. 10 is a cross-sectional view illustrating a semiconductor device 1D according to the fifth embodiment. Elements having the same names or functions as those in the drawings described in the above-described embodiment are denoted by the same reference numerals. Hereinafter, the description will be omitted except for the matters changed or added. Line P-P and line Q-Q illustrated in FIG. 10 are used for describing an embodiment to be described later, and will not be described in the present embodiment.

In the fourth embodiment, it has been described that the inter-gate electrode 6*a* of the source electrode 6 is disposed between the gate electrode 4*a* and the gate electrode 4*b*, and thus the capacitance Cgs can be further increased. In the fifth embodiment, the insulation film 5 is further added, and thus the capacitance Cgs is further increased.

In the fifth embodiment, as illustrated in FIG. 10, the source electrode 6 includes the inter-gate electrode 6*a* disposed between the gate electrode 4*a* and the gate electrode 4*b*. The insulation film 5 is disposed between the gate electrode 4a and the inter-gate electrode 6a and between the gate electrode 4b and the inter-gate electrode 6a. The insulation film 5 is disposed also on the bottom surface of the opening OP. The insulation film 3 may not be disposed between the gate electrode 4a and the inter-gate electrode 6a and between the gate electrode 4b and the inter-gate electrode 6a.

As described above, in the separate gate structure, the inter-gate electrode 6a of the source electrode 6 is disposed between the gate electrode 4a and the gate electrode 4b, and the insulation film 5 is further disposed between the gate electrodes 4a and 4b and the inter-gate electrode 6a. Therefore, according to the fifth embodiment, the gate-source capacitance Cgs can be made greater than that of the fourth embodiment while maintaining the insulation film thickness having a predetermined dielectric strength.

Modification Example of Fifth Embodiment

Figure 11:
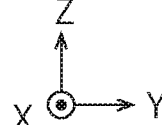
FIG. 11 is a cross-sectional view illustrating another configuration example of the semiconductor device according to the fifth embodiment.

The modification example of the fifth embodiment will be described with reference to FIG. 11. As illustrated in FIG. 11, the semiconductor device 1D according to the present modification example further includes the FP electrode 9 as in the modification example of the fourth embodiment.

As illustrated in FIG. 11, the FP electrode 9 is disposed in the insulation film 3 so as to be positioned below the inter-gate electrode 6a. The thickness of the insulation film between the gate electrode 4a and the source electrode 6 and between the gate electrode 4b and the source electrode 6 can be increased by disposing the FP electrode 9, and the dielectric strength between the gate and the source of the semiconductor device 1D can be improved.

Sixth Embodiment

Figure 12:
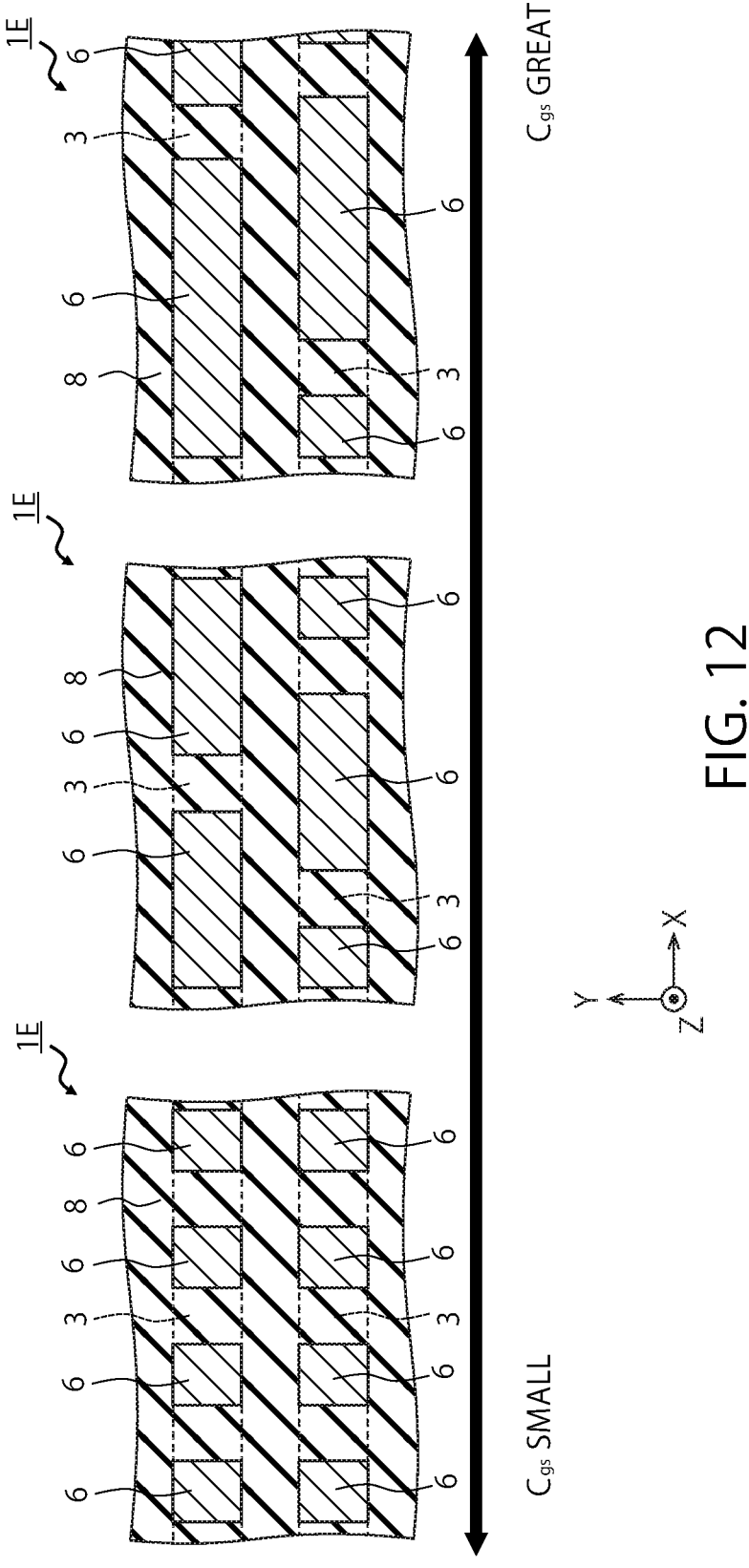
FIG. 12 is a plan view illustrating a semiconductor device according to a sixth embodiment.
Figure 13:
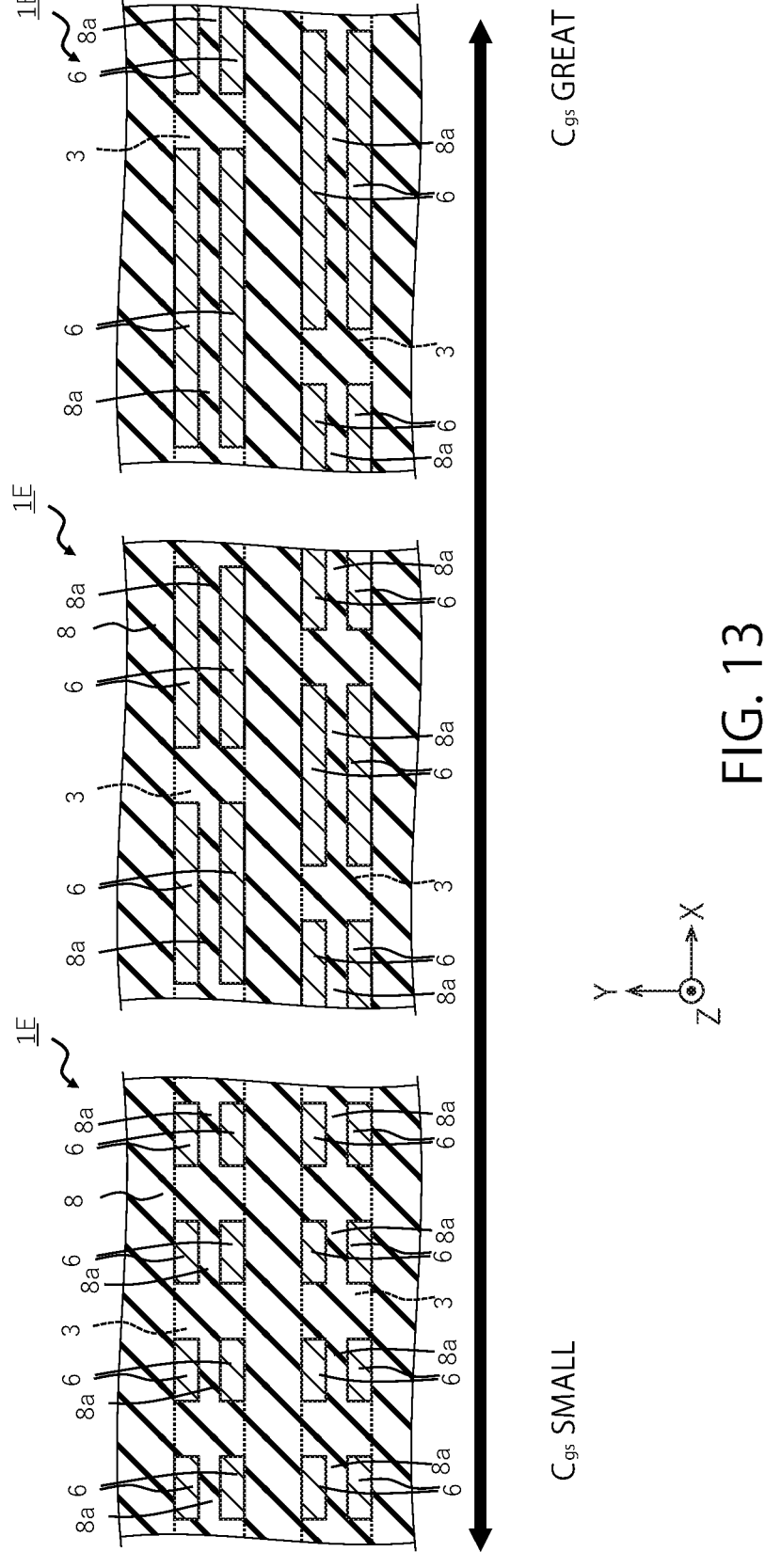
FIG. 13 is a plan view illustrating another configuration example of the semiconductor device according to the sixth embodiment.

Next, the sixth embodiment will be described with reference to FIG. 12 and FIG. 13. FIG. 12 and FIG. 13 are plan views illustrating a semiconductor device 1E according to the sixth embodiment. Elements having the same names or functions as those in the drawings described in the above-described embodiment are denoted by the same reference numerals. Hereinafter, the description will be omitted except for the matters changed or added. FIG. 12 and FIG. 13 are views illustrating a cross section (horizontal cross section) that passes through the insulation film 8 and is parallel to the XY plane, and are, for example, cross-sectional views taken along line P-P illustrated in FIG. 10.

As described above, it has been described that the capacitance Cgs is adjusted by devising the cross-sectional structure of the semiconductor device, for example, by providing the insulation film 8a and the FP electrode 9. In the sixth embodiment, a method of adjusting the capacitance Cgs by devising a planar layout of the source electrode 6 will be described.

As illustrated in FIG. 12, in the semiconductor device 1E according to the present embodiment, the insulation film 8 is partially provided with a plurality of openings in a direction (in a longitudinal direction or in an X-axis direction) in which the insulation film 3 (trench T and the gate electrode 4) extends, and the source electrode 6 is disposed in each opening. That is, a plurality of the source electrodes 6 are partially disposed in the longitudinal direction of the insulation film 3. In other words, in the present embodiment, in the horizontal cross section passing through the insulation film 8, a portion in which each of the source electrodes 6 is disposed and a portion in which the insulation film 8 is disposed alternately exist in the longitudinal direction.

As illustrated in FIG. 13, the opening of the insulation film 8 may be partially provided in a width direction (direction orthogonal to the longitudinal direction or in a Y-axis direction) of the insulation film 3. In this case, a plurality of the source electrodes 6 are partially disposed in the width direction. The insulation film 8a is disposed between the source electrodes 6 partially disposed in the width direction of the trench T. In a case where the opening of the insulation film 8 is partially provided in the width direction of the insulation film 3, the opening may not be provided in the longitudinal direction.

The separate gate structure (gate electrodes 4a and 4b) may be applied to the semiconductor device 1E.

As described above, in the sixth embodiment, the capacitance Cgs can be adjusted by partially providing the opening OP in the longitudinal direction and/or width direction of the trench T and disposing the source electrode 6 in each opening OP. That is, in the portion in which the source electrode 6 is disposed, a distance between the gate electrode 4 (gate electrodes 4a and 4b) and the source electrode 6 decreases, and thus the capacitance Cgs increases. On the other hand, in the portion in which the insulation film (insulation film 8 and the insulation film 8a) is disposed, the distance between the gate electrode 4 (gate electrodes 4a and 4b) and the source electrode 6 increases, and thus capacitance Cgs decreases.

In the sixth embodiment, the layout (arrangement density) of the source electrode 6 in the horizontal plane is adjusted and thus the capacitance Cgs of the entire MOSFET can be adjusted. In other words, the entire area and arrangement density of the source electrode 6 disposed in the opening OP (openings OP1 and OP2) are determined based on a design value of the capacitance Cgs of the MOSFET. In FIG. 12 and FIG. 13, the arrangement density of the source electrodes 6 is higher in the layout on the right side than in the layout on the left side, and thus the capacitance Cgs is greater.

The shape of the source electrode 6 disposed in the opening OP (openings OP1 and OP2) of the insulation film 8 is not limited to a rectangular shape, and may be any shape such as a circular shape or a polygonal shape.

Seventh Embodiment

Figure 14:
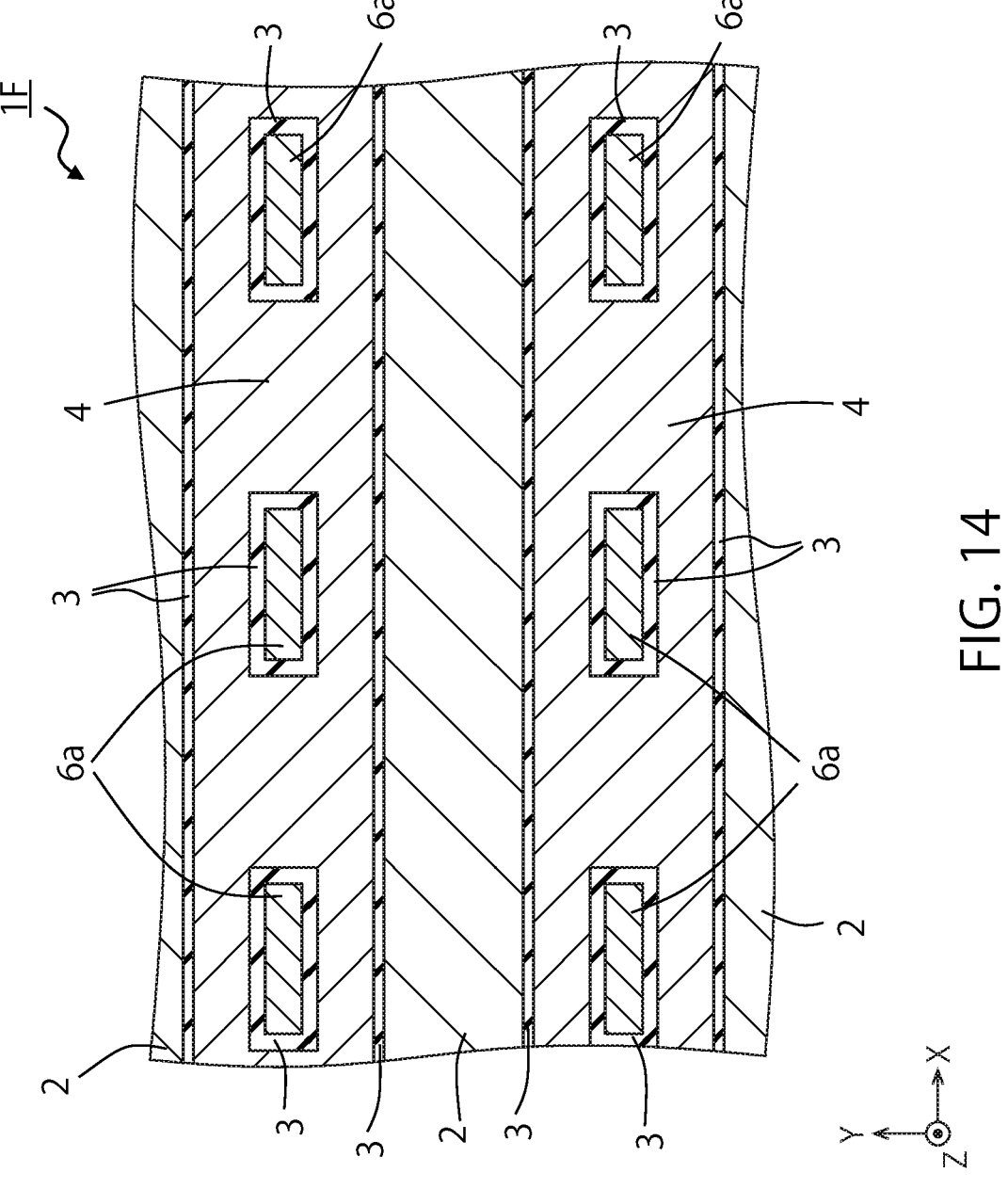
FIG. 14 is a plan view illustrating a semiconductor device according to a seventh embodiment.
Figure 15:
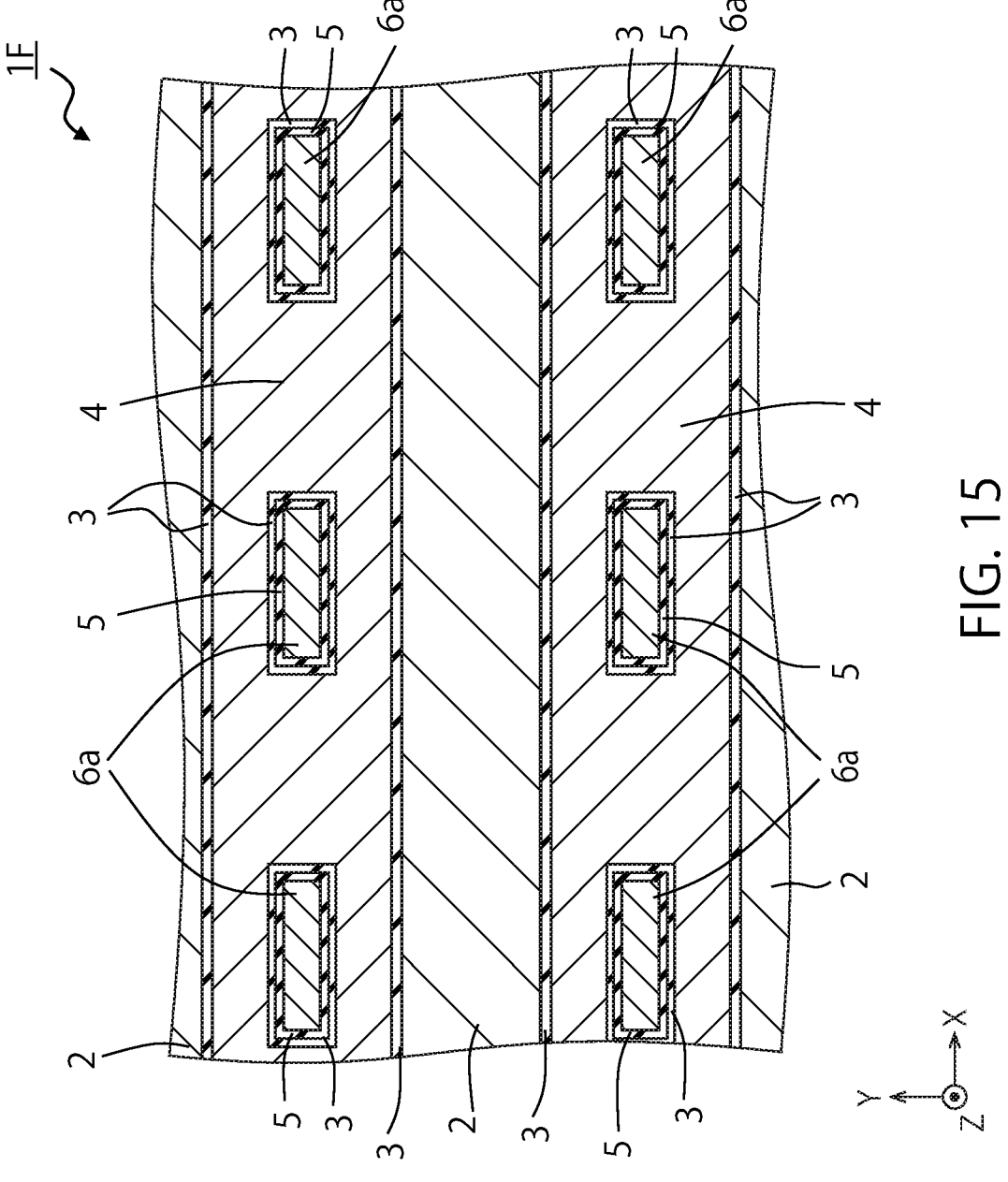
FIG. 15 is a plan view illustrating another configuration example of the semiconductor device according to the seventh embodiment.

Next, the seventh embodiment will be described with reference to FIG. 14 and FIG. 15. FIG. 14 and FIG. 15 are plan views illustrating a semiconductor device 1F according to the seventh embodiment. FIGS. 14 and 15 are horizontal cross-sectional views (for example, cross-sectional views taken along line Q-Q illustrated in FIG. 10) passing through the gate electrodes included in the semiconductor devices described in the fourth and fifth embodiments. Elements having the same names or functions as those in the drawings described in the above-described embodiment are denoted by the same reference numerals. Hereinafter, the description will be omitted except for the matters changed or added.

In the present embodiment, the inter-gate electrode 6a described in the fourth and fifth embodiments is partially provided in an extending direction of the insulation film 3 (trench T), and thus the capacitance Cgs is adjusted.

Specifically, as illustrated in FIG. 14, in the horizontal cross section passing through the gate electrode 4, the gate electrode 4 is provided with a plurality of through holes (three through holes in FIG. 14) in a direction (X-axis direction) in which the insulation film 3 (gate electrode 4 and trench T) extends. The source electrode 6 includes a plurality of inter-gate electrodes 6a disposed in the through holes, respectively. The insulation films 3 are disposed between the gate electrode 4 and a plurality of the inter-gate electrodes 6*a*.

As described above, the semiconductor device 1F has a configuration in which the structure described in the fourth embodiment is partially disposed. That is, a plurality of the inter-gate electrodes 6*a* are partially provided in a direction (X-axis direction) in which the insulation film 3 (trench T) extends. As illustrated in FIG. 14, as viewed in the X-axis direction, the gate electrode 4 is disposed between a plurality of the inter-gate electrodes 6*a*. Therefore, in the semiconductor device 1F, the capacitance Cgs of the entire semiconductor device 1F can be increased, and the gate width of the entire semiconductor device 1F, that is, the gate resistance and gate capacitance of the entire semiconductor device 1F can be adjusted.

As illustrated in FIG. 15, in the semiconductor device 1F may further include the insulation film 5. The insulation film 5 is disposed between the gate electrode 4 and a plurality of the inter-gate electrodes 6*a*. In this case, the insulation film 3 may or may not be disposed between the gate electrode 4 and each of the inter-gate electrodes 6*a*. In any case, since the insulation film 5 is disposed, the capacitance Cgs of the semiconductor device 1F can be further increased.

In the semiconductor device 1F, the gate electrodes 4*a* and 4*b* may be provided as gate electrodes instead of the gate electrode 4.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a drain electrode;
   a source electrode;
   a semiconductor region disposed between the drain electrode and the source electrode;
   a gate electrode disposed in the semiconductor region via a first insulation film;
   a second insulation film disposed between the gate electrode and the source electrode and having a specific dielectric constant higher than a specific dielectric constant of the first insulation film; and
   a third insulation film provided between the second insulation film and the source electrode, and provided with an opening through which the second insulation film is exposed,
   wherein the opening is located between the gate electrode and the source electrode, and a part of the source electrode is disposed in the opening.

2. The semiconductor device according to claim 1, further comprising a fourth insulation film partially disposed on the second insulation film located in the opening.

3. The semiconductor device according to claim 1, wherein the gate electrode extends in a second direction orthogonal to a first direction from the drain electrode toward the source electrode, and
   a plurality of the openings are provided in the second direction and in a third direction orthogonal to the first direction and the second direction.

4. The semiconductor device according to claim 1, wherein the third insulation film is made of silicon oxide.

5. A semiconductor device comprising:
   a drain electrode;
   a source electrode;
   a semiconductor region disposed between the drain electrode and the source electrode;
   a gate electrode disposed in the semiconductor region via a first insulation film;
   a second insulation film disposed between the gate electrode and the source electrode and having a specific dielectric constant higher than a specific dielectric constant of the first insulation film; and
   a third insulation film provided between the second insulation film and the source electrode, and provided with a plurality of openings through which the second insulation film is exposed,
   wherein the gate electrode extends in a second direction orthogonal to a first direction from the drain electrode toward the source electrode, and includes a first gate electrode and a second gate electrode that are provided to be separated from each other in a third direction orthogonal to the first direction and the second direction, and a part of the first insulation film is provided between the first gate electrode and the second gate electrode, and
   wherein each of the openings is provided between the first gate electrode and the source electrode and between the second gate electrode and the source electrode, and a part of the source electrode is disposed in the opening.

6. A semiconductor device comprising:
   a drain electrode;
   a source electrode;
   a semiconductor region disposed between the drain electrode and the source electrode;
   a gate electrode provided in the semiconductor region via a first insulation film; and
   a second insulation film provided between the semiconductor region and the source electrode, and provided with an opening at a position corresponding to an upper side of the first insulation film,
   wherein the gate electrode extends in a second direction orthogonal to a first direction from the drain electrode toward the source electrode, and includes a first gate electrode and a second gate electrode that are provided to be separated from each other in a third direction orthogonal to the first direction and the second direction,
   wherein the source electrode includes an inter-gate electrode disposed between the first gate electrode and the second gate electrode, and the first insulation film is disposed between the source electrode and the first gate electrode and between the source electrode and the second gate electrode, and
   wherein the opening is located between the gate electrode and the source electrode, and a part of the source electrode is disposed in the opening.

* * * * *